United States Patent
Kadijk et al.

(10) Patent No.: US 11,047,559 B2
(45) Date of Patent: *Jun. 29, 2021

(54) LIGHT SOURCE COOLING BODY, LIGHT SOURCE ASSEMBLY, A LUMINAIRE AND METHOD TO MANUFACTURE A LIGHT SOURCE COOLING OR A LIGHT SOURCE ASSEMBLY

(71) Applicant: SIGNIFY HOLDING B.V., Eindhoven (NL)

(72) Inventors: Simon Eme Kadijk, Eindhoven (NL); Theodoor Cornelis Treurniet, Eindhoven (NL); Susanne Lina Goldbach, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/776,805

(22) Filed: Jan. 30, 2020

(65) Prior Publication Data

US 2020/0166203 A1 May 28, 2020

Related U.S. Application Data

(63) Continuation of application No. 15/328,050, filed as application No. PCT/EP2015/062634 on Jun. 8, 2015, now Pat. No. 10,578,293.

(30) Foreign Application Priority Data

Jul. 22, 2014 (EP) ..................................... 14177929

(51) Int. Cl.
*F21V 29/503* (2015.01)
*F21V 29/51* (2015.01)
(Continued)

(52) U.S. Cl.
CPC ............ *F21V 29/503* (2015.01); *F21V 29/51* (2015.01); *F21V 29/57* (2015.01); *F21V 29/58* (2015.01);
(Continued)

(58) Field of Classification Search
CPC ........... H01L 23/427; H01L 2933/0075; H01L 33/62; H01L 33/641; H01L 33/642;
(Continued)

(56) References Cited

U.S. PATENT DOCUMENTS 6,474,074 B2 11/2002 Ghoshal
7,300,187 B2 11/2007 Huang et al.
(Continued)

FOREIGN PATENT DOCUMENTS

CN       101042231 A    9/2007
DE    102007038909 A1   2/2009
(Continued)

OTHER PUBLICATIONS

S. Khandekar, et al., "Closed and Open Loop Pulsating Heat Pipes", Proceedings of 13th International Heat Pipe Conference, Shanghai, China, Sep. 21-25, 2004.
(Continued)

*Primary Examiner* — Peggy A Neils

(57) ABSTRACT

A light source cooling body (100), a light source assembly, a luminaire and a method to manufacture a light source cooling body or a light source assembly are provided. The light source cooling body comprises a homogeneous body (104) made of a thermally conductive material. The homogenous body comprises an open space that comprises a wick structure, a condenser (112) and an evaporator (116). Near the evaporator the light source cooling body has an interface area (102) to thermally couple with a light source and to receive heat from the light source. The condenser is arranged
(Continued)

away from the interface area. A portion 114 of the open space is tubular shaped. The open space may hold a cooling liquid partially in the gaseous phase and partially in the liquid phase and the wick structure is configured to transport the cooling material in the liquid phase towards the evaporator.

20 Claims, 7 Drawing Sheets

(51) Int. Cl.
| | |
|---|---|
| *F21V 29/70* | (2015.01) |
| *F21V 29/57* | (2015.01) |
| *F21V 29/58* | (2015.01) |
| *F21V 29/61* | (2015.01) |
| *F21V 29/76* | (2015.01) |
| *F21V 29/85* | (2015.01) |
| *F21V 29/87* | (2015.01) |
| *F21V 29/89* | (2015.01) |
| *H01L 33/58* | (2010.01) |
| *H01L 33/62* | (2010.01) |
| *H01L 33/64* | (2010.01) |
| *H01L 23/427* | (2006.01) |
| *F21Y 115/10* | (2016.01) |
| *F21V 29/505* | (2015.01) |
| *F21Y 115/30* | (2016.01) |

(52) U.S. Cl.
CPC .............. *F21V 29/61* (2015.01); *F21V 29/70* (2015.01); *F21V 29/763* (2015.01); *F21V 29/767* (2015.01); *F21V 29/86* (2015.01); *F21V 29/87* (2015.01); *F21V 29/89* (2015.01); *H01L 33/58* (2013.01); *H01L 33/62* (2013.01); *H01L 33/641* (2013.01); *H01L 33/642* (2013.01); *H01L 33/648* (2013.01); *F21V 29/505* (2015.01); *F21Y 2115/10* (2016.08); *F21Y 2115/30* (2016.08); *H01L 23/427* (2013.01); *H01L 2924/0002* (2013.01); *H01L 2933/0066* (2013.01); *H01L 2933/0075* (2013.01)

(58) Field of Classification Search
CPC .... H01L 33/648; F21V 29/006; F21V 29/503; F21V 29/763; F21V 29/86; F21V 29/89; F21V 29/51; F21V 29/70; F21Y 2115/10
See application file for complete search history.

(56) References Cited

U.S. PATENT DOCUMENTS

| | | | |
|---|---|---|---|
| 7,543,960 B2 | 6/2009 | Chang et al. | |
| 8,247,956 B2 | 8/2012 | Liu | |
| 8,378,559 B2* | 2/2013 | Shuja | F21V 29/006 |
| | | | 313/34 |
| 8,471,274 B2 | 6/2013 | Golle et al. | |
| 8,491,162 B2 | 7/2013 | Lee | |
| 8,657,471 B2 | 2/2014 | Huang et al. | |
| 8,759,843 B2 | 6/2014 | Ramer et al. | |
| 9,488,359 B2 | 11/2016 | Le et al. | |
| 10,578,293 B2* | 3/2020 | Kadijk | H01L 33/62 |
| 2002/0062648 A1 | 5/2002 | Ghoshal | |
| 2007/0189012 A1 | 8/2007 | Huang et al. | |
| 2007/0272399 A1 | 11/2007 | Nitta et al. | |
| 2008/0150126 A1 | 6/2008 | Zhou et al. | |
| 2008/0175008 A1 | 7/2008 | Hu et al. | |
| 2008/0291675 A1 | 11/2008 | Lin et al. | |
| 2009/0278460 A1 | 11/2009 | Chen | |
| 2010/0078151 A1 | 4/2010 | Koenigsberg et al. | |
| 2010/0181590 A1 | 7/2010 | Chen | |
| 2011/0127013 A1 | 6/2011 | Kawamura et al. | |
| 2011/0232877 A1 | 9/2011 | Meyer, IV et al. | |
| 2011/0310608 A1 | 12/2011 | Lapatovich et al. | |
| 2013/0039057 A1 | 2/2013 | Lee et al. | |
| 2014/0049964 A1 | 2/2014 | McClure et al. | |
| 2016/0102854 A1 | 4/2016 | Xiang | |

FOREIGN PATENT DOCUMENTS

| | | |
|---|---|---|
| EP | 2397753 A1 | 12/2011 |
| WO | 2007113942 A2 | 10/2007 |
| WO | 2013154358 A1 | 10/2013 |
| WO | 2013156521 A1 | 10/2013 |

OTHER PUBLICATIONS

HTTP:f/CLEANTECHNICA.COM, "Versatile LUXeXceL Invests in 30 Factory for LED Optics", Mar. 26, 2014, pp. 1-4.

\* cited by examiner

LIGHT SOURCE COOLING BODY, LIGHT SOURCE ASSEMBLY, A LUMINAIRE AND METHOD TO MANUFACTURE A LIGHT SOURCE COOLING OR A LIGHT SOURCE ASSEMBLY

CROSS-REFERENCE TO PRIOR APPLICATIONS

This application is a continuation of U.S. application Ser. No. 15/328,050, filed on Jan. 22, 2017, which is a U.S. National Phase application under 35 U.S.C. § 371 of International Application No. PCT/EP2015062634, filed on Jun. 8, 2015, which claims the benefit of European Patent Application No. 14177929.9, filed on Jul. 22, 2014. These applications are hereby incorporated by reference herein.

FIELD OF THE INVENTION

The invention relates to the field of cooling bodies to which a light source may be coupled to cool the light source. The invention also relates to light source assemblies, luminaires, methods to manufacture such cooling bodies and methods to manufacture a light source assembly.

BACKGROUND OF THE INVENTION

Heat management is important in light sources, in particular when solid state light emitters like Light Emitting Diodes (LEDs) are used as light emitter. LEDs generate on a relatively small area a relatively large amount of light and a relatively large amount of heat that must somehow be conducted towards the environment. When a LED becomes too hot, the LED may become permanently damaged resulting in a non-functional light source. Several solutions have been proposed like providing thermal paths via heat conductive materials towards a heat sink (which comprises, for example, cooling fins).

Published patent application US2008/0150126, which is incorporated by reference, discloses a Light Emitting Diode (LED) module with a heat dissipation device. The heat dissipation device includes a plurality of heat spreaders each supporting at least one LED, includes a base that supports the heat spreaders and includes a heat pipe sandwiched between the base and the heat spreader. The heat spreaders are thermally connected together via the heat pipe.

The heat dissipation device according to the cited prior art spreads the heat generated in the LEDs locally with the heat spreaders and uses the heat pipe to spread the heat along a larger space. The base is, for example, a heat sink with cooling fins. The heat dissipation device provides heat spreading such that the temperature of the LEDs is not becoming too high. The cooling capacity of the heat dissipation device is limited by the amount of heat that can be transferred between the different elements (LED-heat spreaders-heat pipe-base) and, finally, to the environment. Furthermore, the cooling capacity of the base strongly depends on manufacturing limitations of such a base—for example, with known manufacturing technologies like extrusion or molding it is almost impossible to manufacture cooling fins that provide an optimum between a size of a surface in contact with the environmental air, conduction of heat by the fins, and space for environmental air to flow through the cooling fins. Thus, the heat dissipation device is capable of cooling LEDs, but has also limitations in its cooling capacity.

There is a tendency to increase the power of the LEDs and the heat dissipation device of the cited patent application lacks cooling capacity for such high power LEDs.

SUMMARY OF THE INVENTION

It is an object of the invention to provide a better cooling solution for a light source.

An aspect of the invention provides a light source cooling body. A further aspect of the invention provides a light source assembly. An aspect of the invention provides a luminaire. Another aspect of the invention provides a method of manufacturing a light source cooling body. Yet a further aspect of the invention provides a method of manufacturing a light source assembly.

A light source cooling body in accordance with the first aspect of the invention comprises a hollow space and an interface area. Substantially the whole light source cooling body is manufactured of the same thermally conductive material. The hollow space comprising an evaporator, a condenser and a wick structure. The open space is configured to hold a cooling material partially in a gaseous phase and partially in a liquid phase. A wall of the open space is formed by the thermally conductive material. At least a portion of the hollow space is tubular shaped. The wick structure is arranged to transport the cooling material in the liquid phase towards the evaporator for being evaporated in the evaporator when the evaporator receives heat. The wick structure is also manufactured of the thermally conductive material. The interface area is arranged the thermally coupled with a light source and to receive heat from the light source. The interface area is an outer area of the light source cooling body and is arranged in the direct vicinity of the evaporator and is separated by a thermally conductive wall from the evaporator for allowing heat of the light source to be transported towards the evaporator. The condenser is arranged away from the interface area. Except the hollow space, the light source cooling body is a homogeneous body of the thermally conductive material. The interface area comprises a protrusion having a flat surface facing away from the light source cooling body, wherein the flat surface being configured to thermally couple to a surface of a light source.

Thus, the light source cooling body is a homogeneous body which implies that it does not comprise different materials between which transition interfaces exist. The transition interfaces may comprise air and, thus, they may each form a thermal barrier. The thermal path from the interface area towards the evaporator is only through the thermally conductive material and is not obstructed by transition interfaces between different materials. Thus, the heat generated in the light source that is thermally coupled to the interface area can easily flow towards the evaporator to evaporate the cooling material (available in the liquid phase) into in the gaseous phase. The cooling material in the gaseous phase can easily flow towards the condenser via the hollow space. The condenser is away from the interface area and is consequently less warm than the direct environment of the interface area and the evaporator. Because of the lower temperature, in the condenser the cooling material may condensate thereby delivering heat from the light source to the environment of the condenser. Again, the condenser is only surrounded by the material of the light source cooling body and no other materials and/or transition interfaces prevent the transfer of heat from the cooling material in the gaseous phase to the material of the light source cooling body. Depending on the direct environment of the light source cooling body, the heat that is transferred to the material of the light source cooling body (near the condenser) may be further transferred to the direct environment. For example, when the light source cooling body is surrounded, in the environment of the condenser, by air convection may lead to the delivery of heat to the environmental air.

The above mechanism at least leads to a very good heat spreading within the light source cooling body. As such, when a light source in operation is thermally coupled to the interface area, temperature differences will be relatively small between the temperature of the light source and specific parts of the light source cooling body. Furthermore, because the temperature differences are relatively low, more heat can be conducted towards/provided to the direct environment of the light source cooling body. As such a good cooling mechanism is provided for the light source and a relatively good thermal management of a light source assembly or luminaire may be obtained when the light source cooling body is integrated in such a light source assembly or such a luminaire.

Furthermore, the fact that the light source cooling body is a homogeneous body means that the light source cooling body is a one-piece-component. Thereby, compared to the known cooling solutions in which, for example, heat pipes are used, the amount of components is reduced and no specific assembling steps are required during the production of the light source cooling body. Thereby manufacturing costs are saved. Additionally, when the light source cooling body is made of the same thermally conductive material, additive manufacturing technologies may be used to manufacture the light source cooling body. Such technologies are, for example, direct metal laser sintering, selective laser sintering, electron beam melting, fused deposition modeling, 3d printing based on extrusion and additive manufacturing based on using arc wires. In general, in an additive manufacturing technology, the component is build up in layers. Subsequently, when such additive manufacturing technologies are used, one can easily optimize the shape of the light source cooling body and the shape of the hollow space. Traditionally, when heat pipes are used, the number of bends that can be made in the heat pipes are limited because it would damage the internal structure of the heat pipe too much, while with additive manufacturing the internal structure may be optimized at every position—for example, the shape of the hollow space may be optimized.

Please note that the evaporator is arranged near the interface area and the condenser is arranged away from the interface area. This means that the evaporator is arranged closer to the interface area than the condenser.

The hollow space forms a (regular non-loop) heat pipe or a loop heat pipe wherein the wick is provided to transport the cooling material in the liquid phase towards the evaporator. A pressure of the cooling material in the gaseous phase allows the transport of the cooling material from the evaporator to the condenser. The wick provides via a capillary action the transport in the opposite direction. When the hollow space forms a loop heat pipe, the wick is located close to and/or partially in the evaporator to transport the cooling material from the end of the loop (or a liquid reservoir) into the evaporator. When the hollow space is a regular (non-loop) heat pipe, the wick will extend from the condenser up to (into) the evaporator. The wick may comprise grooves, arteries, porous sponge-like structure, mesh-like structure to generate sufficient capillary pressure for transporting the cooling material in the liquid phase to an area of the evaporator where the cooling material evaporates when heat is received by the evaporator.

As discussed above, the interface area comprises a protrusion having a flat surface facing away from the light source cooling body, wherein the flat surface being configured to thermally couple to a surface of a light source. For example, when the light source is a solid state light emitter, a flat contact area to the solid state light emitter is advantageous because solid state light emitters have in general a flat surface configured to be coupled to another component. The fact that the interface area comprises a protrusion creates possibilities to provide around the protrusion "lowered" electrical connections for providing power to the light source. When the solid state light emitter is coupled with its lower surface to the protrusion one may the "lowered" electrical connections to connect to the lower surface of the solid state light emitter. In particular the protrusion allows the use of so-termed flip-chip LEDs which have at least at one of their surfaces a light exit window through which light is emitted in the ambient and which have at a surface opposite the light exit window power contact areas by which the flip-chip LED has to be connected to power lines, such as the "lowered" electrical connections. The protrusions provide a good thermal path to the evaporator because they are part of the homogeneous body of the light source cooling body and the flip-chip LEDs may extends, in a plane defined by the flat surface, beyond the protrusion. In the area that they extends beyond the protrusion contact areas may be provided on the flip-chip LEDs for begin connected to power lines. In other words, the protrusion provides an advantageous way of coupling light sources to the light source cooling body when the light source has a light exit window at a top surface and has at a bottom surface (opposite the top surface) electrical contact—the bottom surface may be coupled to the protrusion and at least a portion of the bottom surface with the electrical contacts may extend beyond the protrusion such that the electrical contacts may be coupled to powerlines.

When the light source cooling body is suitable for coupling a plurality of light sources to, the interface area comprises a plurality of corresponding protrusions. It is to be noted that the protrusion, or in specific embodiments, the protrusions are well thermally coupled to the evaporator. For example, the protrusions start at the wall of the evaporator and extends away from the evaporator. Optionally, the interface area and/or the protrusion(s) comprise fasteners for fastening the light source to the interface area. Another advantage of using protrusions is that the light source that is coupled to the protrusion is arranged at a short distance above the surface of the light source cooling body and may emit light in an angular range that is larger than 180 degrees. Because the light source cooling body can be manufactured by means of an additive manufacturing method, the wick structure can be optimized. For example, when the hollow space is a tube that has bends or is partially circular, the wick structure can be optimized for such bends such that the capillary action is still optimal. This is not possible with the known heat pipe structures which are made as a straight pipe and bended afterwards thereby damaging the wick structure and reducing its capillary action.

Optionally, the thermal conductivity of the thermal path from the interface area towards the evaporator is larger than 3 W/mK. Optionally, the thermal conductivity of the thermal path from the interface area towards the evaporator is larger than 30 W/mK.

Optionally, the hollow space is at least partially tubular shaped. For example, the hollow space comprises a tube connecting the condenser with the evaporator.

Optionally, the hollow space also comprises a sealable opening to the outside of the light source cooling body. The sealable opening may be used for pumping air out of the hollow space and for providing the cooling material into the hollow space.

Optionally, the light source cooling body comprises the cooling material partially in the liquid phase and partially in the gaseous phase and, when a sealable opening is provided, the sealable opening is liquid and gas tightly sealed.

Optionally, the light source cooling body further comprising cooling fins for providing an interface area to ambient/environmental air. The condenser being arranged near the cooling fins for obtaining a well-thermally conductive path from the condenser to the cooling fins. The cooling fins are also a part of the homogeneous body of the thermally conductive material. In other words, the cooling fins are an integral part of the light source cooling body.

The cooling fins are part of the interface of the light source cooling towards the environment. The cooling fins provide a relatively large interface area to the environment of the light source cooling body and, as such, a lot of heat can be provided to the environment. Thereby a lot of heat can be conducted away from the light source to the environment via the hollow space and, thus, the light source is well cooled. Because the cooling fins are also an integral part of the homogeneous light source cooling body, no additional interfaces (which might comprise air or other thermally isolating materials) are present in the thermal path from the condenser towards the cooling fins, and, thus, a relatively large amount of heat can be transported to the cooling fins.

Optionally, the thermal conductivity of the thermal path from the condenser towards the cooling fins is larger than 3 W/mK. Optionally, the thermal conductivity of the thermal path from condenser towards the cooling fins is larger than 30 W/mK.

Optionally, the light source cooling body comprises a heat sink interface area being arranged to thermally couple a heat sink to and configured to provide heat to the heat sink. The heat sink interface area is a further outside area of the light source cooling body arranged close to the condenser and may optionally comprise connector elements for connecting a heat sink to the heat sink interface area. The heat sink interface may be provide in addition to, or alternatively to, the cooling fins.

Optionally, a shape of the light source cooling body (and when the light source cooling body also comprises cooling fins, optionally also the shape of the cooling fins), is selected to allow a transmission or light generated by a light source provided on the interface area towards an ambient of the light source cooling body. Thus, in other words, the shape of the light source cooling body is specifically design for the purpose of lighting applications. It might be that parts of the light source cooling body receive (and optionally absorb) light from the light source provided on the interface area, but at least a large portion of the generated light (for example, more than 70%) is emitted into the ambient of the light source cooling body. Optionally, parts of the light source cooling body that receive light from the light source provided on the interface area are at least partially reflective such that a large portion of the light impinging on those parts is reflected (for example, more than 70%). These optional embodiments prevent that the light source cooling body introduces optical inefficiency and it is prevented that the light source cooling body is heated by absorbed impinging light thereby introducing thermal inefficiency.

Optionally, a thickness of a thermally conductive wall between the interface area and the evaporator is thinner than 2 millimeter. Thus, when, from the evaporator towards the interface area, a shortest thickness of the thermally conductive material is measured, the measurement should reveal that the thickness is less than 2 millimeter. Such a relatively thin thermally conductive wall provides a short thermal path from the interface area to the evaporator and, thus, a thermal path of a high thermal conductivity. When the interface area comprises one or more protrusions, the protrusions are also part of the thermally conductive wall. Optionally, the thickness of the thermally conductive wall is thinner than 1.5 millimeter. Optionally, the thickness of the thermally conductive wall is thinner than 1 millimeter.

Optionally, the wall of the hollow space is at least partially covered with the wick for transporting the cooling material in the liquid phase from the condenser towards the evaporator. Optionally, the wick extends at least partly in evaporator. Optionally, the wick extends at least partially in condenser. Optionally, the wick is provided at least partially in hollow space between evaporator and condenser. This optional embodiment applies to the above discussed "regular" (non-loop) heat pipe.

Optionally, the hollow space forms a loop in which a vapor channel is provided from the evaporator towards the condenser and a liquid channel is provided from the condenser to the evaporator, the wick being arranged to receive cooling material in the liquid phase from the liquid channel or a liquid reservoir being fed by the liquid channel and the wick at least extends into the evaporator. This optional embodiment relates to a loop heat pipe.

In embodiment, the presence of the wick structure in the hollow space is not necessary. If no wick structure is present, and if the hollow space is tubular shaped and is arranged in a meandering configuration, wherein the tubular shaped hollow space meanders a plurality of times between the condenser and the evaporator. This optional embodiment relates to a pulsating heat pipe—such a heat pipe does, in general, not have a wick structure. Optionally, the meandering tubular hollow space may also form a loop. A radius of the tubular shaped hollow space is selected such that a good capillary action can be obtained. Often, the tubular shaped hollow space has turns in at the condenser and also at the evaporator. In use, the tubular shaped hollow space comprises locally at several locations some cooling material in the liquid phase and the relative small portions of liquid cooling material are separated from each other by cooling material in the gaseous phase. More information about this type of heat pipes can be found in the article "Closed and open loop pulsating heat pipes" of Sameer Khandekar, et al, published in the proceedings of "13$^{th}$ International Heat Pipe Conference" Shanghai, China, Sep. 21-25, 2004. The cited article is incorporated by reference.

Optionally, the thermally conductive material comprising at least one of Aluminum, Copper, Magnesium, Iron, Nickel, CrNi steel, Carbon steel, a Copper-Zinc alloy, a Copper-Tin alloy, a thermally conducive plastic material, and a thermally conductive ceramic material such as Aluminum Nitride, Aluminum Oxide, Beryllium Oxide, Boron Nitride, Silicon Carbide, Titanium Oxide, Magnesium Oxide, Zinc Oxide, Silicon Nitride, Zirconium Oxide, Tungsten Carbide, and mixes thereof. Examples of thermally conductive plastics relate to a combination of a matrix polymer of Liquid Crystal Polymer (LCP), Poly p-Phenylene Sulfide (PPS), Poly Amide (PA), Poly Propylene (PP) (crystalline or semi-crystalline), Poly Carbonate (PC) (amorphous), Poly Butylene Terephthalate (PBT), and Poly Ethylene Terephthalate (PET) with filler materials like BN or with graphite filler materials.

Optionally, the cooling material comprising at least one of Water, Acetone, Ammonia, Methanole and Ethanole. For example, when the thermally conductive material comprises Aluminum, the cooling material often comprises Acetone. For example, when the thermally conductive material comprises Copper or Nickel, the cooling material often comprises Water.

Optionally, the light source cooling assemblies according to the above discussed embodiments is obtainable by an additive manufacturing technology. Examples and advantages of additive manufacturing technologies are discussed before.

According to another aspect of the invention, a light source assembly is provided which comprises a light source cooling body according to one of the above discussed embodiments and which comprises a light source provided on and thermally coupled to the interface area of the light source cooling body.

Optionally, the light source assembly further comprises electric conductors being provided on and isolated from the light source cooling body for providing electrical power to the light source. For example, dielectric tracks are provided on the light source cooling body and electrically conductive tracks are provided on the dielectric tracks. The electric conductive tracks may have at the interface area connection areas for electrically connecting the light source to. The manufacturing of the dielectric material and the electrically conductive material is based on a manufacturing technology wherein layers are manufactured on top of a three dimensional object. For example, the dielectric material and the electrically conductive material may both also be provided on the light source cooling body by means of an additive manufacturing technology. An example of a suitable additive manufacturing technology are printing technologies that are configured to printing layers on 3d objects.

Optionally, when the light source cooling body comprises cooling fins as an integral part of the light source cooling body, a portion of the cooling fins are also arranged as an optical element for influencing, in use, a light beam emitted by the light source assembly. For example, the portion of the cooling fins may form a reflector, a collimator, a slat collimator, etc. In such embodiments, the light source cooling body is optionally made of a light reflective material, or the cooling fins are provided with a layer of a light reflective material.

Optionally, the light source comprises a solid state light emitter such as a Light Emitting Diode (LED) or a laser diode. The light source may be a solid state light emitter package, such as a LED provided on a printed circuit board or packaged in any other way. The light source may also comprises a plurality of solid state light emitter dies. The light source assembly is, however, not limited to solid state light emitters only.

Optionally, the light source is a flip chip Light Emitting Diode being provided on the protrusion, a light exit window of the flip chip Light Emitting Diode faces away from the flat surface of the protrusions, the flip chip Light Emitting Diode has an opposite surface opposite the light exit window, a portion of an opposite surface is provided on the flat surface and another portion of the opposite surface extends beyond the protrusion and comprises electrical contact areas.

According to an aspect of the invention, a luminaire is provided which comprises a previously discussed embodiment of a light source cooling body or which comprises a previously discussed embodiment of a light source assembly.

According to a further aspect of the invention, a method of manufacturing a light source cooling body is provided. The method comprises receiving a three dimensional model of a light source cooling body that comprises i) a hollow space comprising an evaporator and an condenser, the hollow space being configured to hold a cooling material partially in a gaseous phase and partially in a liquid phase, a wall of the hollow space being formed by the thermally conductive material, at least a portion of the hollow space is tubular shaped, the hollow space further comprising a wick for transporting the cooling material in the liquid phase towards the evaporator for being evaporated when the evaporator receives heat; ii) an interface area being arranged to thermally couple a light source to and configured to receive heat from the light source, wherein a) the interface area being arranged in a direct vicinity of the evaporator and being separated by a thermally conductive wall from the evaporator for allowing heat of the light source to be transported towards the evaporator, b) the condenser being arranged away from the interface area where the light source cooling body has an interface to an environment of the light source cooling body, and c) except the interface area, the light source cooling body being a homogeneous body of the thermally conductive material. The method further comprises building up the light source cooling body of a thermally conductive material by depositing layers on top of each other by means of an additive manufacturing technology according to the received three dimensional model of the light source cooling body.

Examples of additive manufacturing technologies are, for example, direct metal laser sintering, selective laser sintering, fused deposition modeling, 3d printing based on extrusion and additive manufacturing based on using an arc wire. When such additive manufacturing technologies are used, one can easily optimize the shape of the light source cooling body and the shape of the hollow space. Traditionally, when heat pipes are used, the number of bends that can be made in the heat pipes are limited because it would damage the internal structure of the heat pipe too much, while with additive manufacturing the internal structure may be optimized at every position—for example, the shape of the hollow space may be optimized. Also, the above manufacturing method builds up the light source cooling body as a homogeneous component made of (optionally) one material. Thereby it is ensured that no interfaces are present in the light source cooling body with a relatively high thermal resistance. Thus, the manufacturing technology enables the manufacturing of light source cooling bodies which provide a better cooling of a light source. In an optional embodiment, the light source cooling body that is build up in layers is sintered afterwards.

According to another aspect a method of manufacturing a light source assembly is provided which comprises the above discussed method of manufacturing a light source cooling body and which at least comprises thermally coupling a light source to the interface area of the manufactured light source cooling body.

Optionally, the method of manufacturing a light source assembly also comprises i) manufacturing dielectric tracks of dielectric material on the light source cooling body, the dielectric tracks extending toward the interface area of the light source cooling body, ii) manufacturing power tracks of an electrically conductive material on the isolation tracks and providing connection areas (as part of the power tracks) at the interface area, the connection areas are for coupling the light source to, and iii) electrically connecting the light source coupled to the interface area to the connection areas. The manufacturing of the dielectric tracks and the power tracks may also be performed by an additive manufacturing technology. This may be the same additive manufacturing technology as used for manufacturing the light source cooling body but, alternatively, this may also be another additive manufacturing technology that is suitable for manufacturing the dielectric tracks and/or the power tracks. It might be that the three dimensional model of the light source cooling body also comprises information about the locations where the dielectric tracks and power tracks must be manufactured. This information may also be received in and used by the method of manufacturing a light source assembly.

These and other aspects of the invention are apparent from and will be elucidated with reference to the embodiments described hereinafter.

Further preferred embodiments of the device and method according to the invention are given in the appended claims, disclosure of which is incorporated herein by reference.

It will be appreciated by those skilled in the art that two or more of the above-mentioned options, implementations, and/or aspects of the invention may be combined in any way deemed useful.

Modifications and variations of the light source cooling body, the method of manufacturing the light source cooling body and/or the manufacturing of a light source assembly which correspond to the described modifications and variations of the light source cooling body, can be carried out by a person skilled in the art on the basis of the present description.

Figure 1:
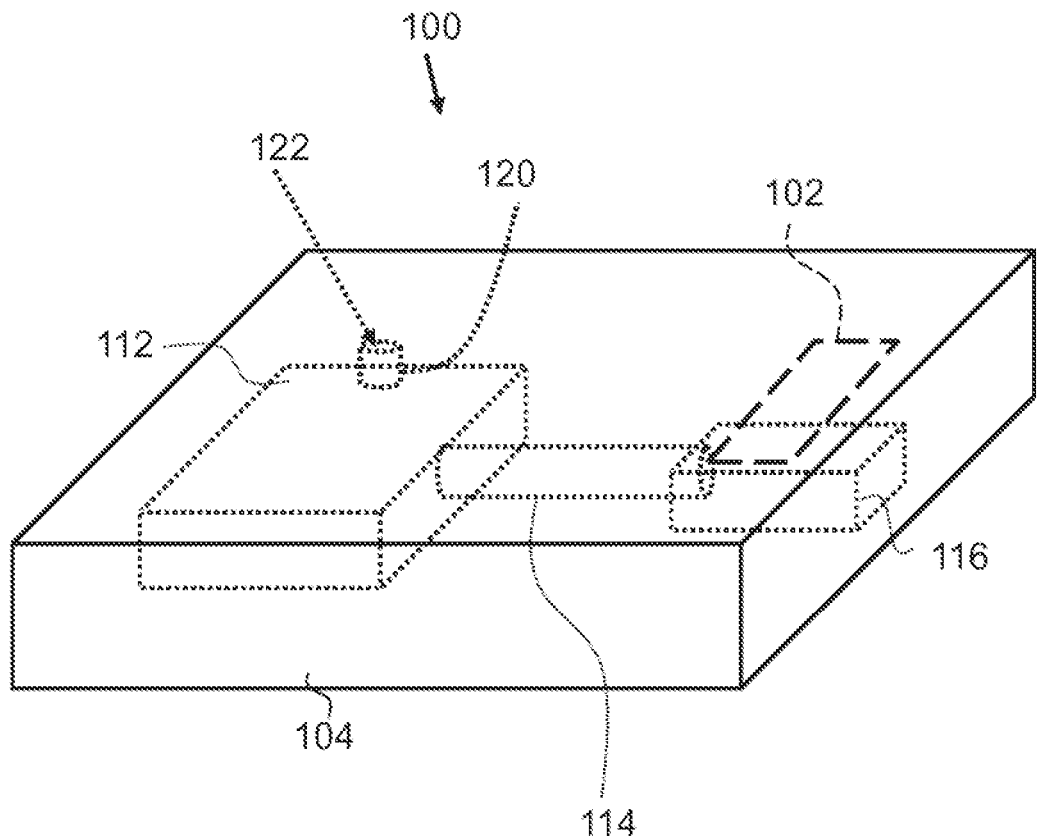
FIG. 1 schematically shows a light source cooling body according to the invention, FIG. 2a schematically shows a top-view of an embodiment of a light source assembly comprising a light source cooling body, FIG. 2b schematically shows a cross-sectional view of the embodiment of FIG. 2a along line II-II', FIG. 3a schematically shows a top-view of another embodiment of a light source assembly comprising a light source cooling body, FIG. 3b schematically shows a cross-sectional view of the another embodiment of FIG. 3a along line III-III', FIG. 4a schematically shows a three dimensional view of a further embodiment light source assembly comprising a light source cooling body, FIG. 4b schematically shows a cross-sectional view of the further embodiment of FIG. 2a along line IV-IV', FIG. 5a schematically shows a light source assembly embodied in a lamp, FIG. 5b schematically shows a luminaire, FIG. 6 schematically shows a method of manufacturing a light source cooling body and a method of manufacturing a light source assembly, FIG. 7a schematically shows an embodiment of a light source assembly, and FIG. 7b schematically shows a cross-sectional view of the embodiment of FIG. 7a along line VII-VII'.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

FIG. 1 schematically shows a light source cooling body 100 according to the invention. The light source cooling body 100 comprises a homogeneous body 104 of a single material that is thermally conductive. Inside the homogeneous body 104 is provided a hollow space that is formed in the example of FIG. 1 by spaces 112, 114 and 116. The hollow space may optionally comprise a small channel 120 to the outside surface of the light source cooling body 100 such that at the outside surface of the light source cooling body 100 is provided a sealable opening that may be used to pump the hollow space empty and provide a cooling material into the hollow space. The walls of the hollow space are formed by the material of the homogeneous body 104. Thus, no additional materials are provided in between the hollow space and the homogeneous body 104. Space 116 is configured as an evaporator in which a cooling material present in a liquid phase and which is evaporated when heat is received by the evaporator 116. The evaporator 116 is positioned close to an interface area 102 at which a light source may be thermally coupled to the light source cooling body such that heat can easily flow from the light source towards the evaporator 116. The thermal path between the interface area 102 and the evaporator 116 is short and has a low thermal resistance. Space 112 is a condenser in which the cooling liquid in the gaseous phase condenses when the environment of the condenser 112 absorbs heat from the condenser 112. The condenser 116 is not located close to the interface area 102, but is positioned away from the interface area 102 at an area of the light source cooling body 100 where the light source cooling body 100 has an outside area that is capable of providing heat to the environment of the light source cooling body 100. Space 114 is a tubular space through which the cooling material, in the gaseous phase and the liquid phase, can be exchanged between the evaporator 116 and the condenser 112. Space 114 may also have a different shape.

The sealable opening 122 may be sealed by, for example, a glass frit that is compatible with the thermally conductive material of the homogeneous body 104 such that a gas and liquid tight seal seals the sealable opening 122. The sealable opening 122 may also be sealed by a low temperature metal composition, such as low temperature solders (for example, SnAgBi). Also the material of the light source cooling body 100 immediately around the sealable opening 122 may be heated with a laser such that the sealable opening is closed by the thermally conductive material of the light source cooling body 100 itself. In particular, immediately after air is pumped out of the hollow space and the cooling material is provided into the hollow space, the sealable opening is sealed. In other embodiments, the sealable opening 122 is closed by punching or pinching off the sealable opening 122. Pinching off is in particular useful when the sealable opening 122 is provided in a small tube protruding out of the homogeneous body 104.

In FIG. 1 the evaporator 116 and condenser 112 are schematically presented as box-shaped areas. Real embodiments of the evaporator 116 and condenser 112 may have different shapes. In an embodiment the whole hollow space is tubular shaped and a portion of the tubular shaped hollow space that is close to the interface area is termed the "evaporator" and a portion of the tubular shaped hollow space that is in an portion of the light source cooling body where the light source cooling body can easily provide heat to the environment is termed the "condenser".

In FIG. 1 the light source cooling body 100 is drawn as a box-shaped body. Other shapes are also possible—for example, the light source cooling body 100 may also be a disk shaped or (solid) cylindrical shaped object. At least is the shape of the light source cooling body 100 in combination with the location of the interface area 102 selected such that, when a light source is provided on the interface area 102, light generated by the light source can easily be transmitted into the ambient of the light source cooling body 100. A portion of the light generated by the light source cooling body 100 may impinge on portions of the light source cooling body 100 and then these portions may be relatively small or these portions are at least partially light reflective.

The material of the light source cooling body is at least thermally conductive which means that its thermal conductivity is at least 3 W/mK. In an advantageous embodiment, the thermal conductivity is higher, e.g. larger than 30 W/mK Hereinafter, in table 1, useful materials are provided.

TABLE 1 thermal conductive materials to be used
in the light source cooling body

| Material | | Thermal conductivity At 20° C. |
|---|---|---|
| Metals | | |
| Cu | Copper | 400 W/mK |
| Al | Aluminum | 100-240 W/mK |
| Mg | Magnesium | 70-150 W/mK |
| Ni | Nickel | 90 W/mK |
| Fe | Iron | 16 W/mK |
| | CrNi steel | 16 W/mK |
| | Carbon steel | 50 W/mK |
| CuZn | Brass | 110 W/mK |
| CuSn | Bronze | 100 W/mK |
| CuSn4P | Phosphor Bronze | |
| Ceramics | | |
| AlN | Aluminum Nitride | 80-260 W/mK |
| $Al_2O_3$ | Aluminum Oxide | 18-36 W/mK |
| BeO | Beryllium Oxide | 184-300 W/mK |
| BN | Boron Nitride | 15-600 W/mK |
| SiC | Silicon Carbide | 60-210 W/mK |
| $TiO_2$ | Titanium Oxide | 11.7 W/mK |
| MgO | Magnesium Oxide | 40-60 W/mK |
| ZnO | Zinc Oxide | 35 W/mK |
| $Si_3N_4$ | Silicon Nitride | 20 W/mK |
| $ZrO_2$ | Zirconium Oxide | 3 W/mK |
| WC—Co | Tungsten Carbide | 85 W/mK |

Optionally, the thermal conductive material of which the light source cooling body 100 is manufactured, comprises a thermally conductive plastic with a thermal conductivity that is larger than 3 W/mK. Examples are a matrix polymer of Liquid Crystal Polymer (LCP), Poly p-Phenylene Sulfide (PPS), Poly Amide (PA), Poly Propylene (PP) (crystalline or semi-crystalline), Poly Carbonate (PC) (amorphous), Poly Butylene Terephthalate (PBT), and Poly Ethylene Terephthalate (PET) with filler materials like Boron Nitride, to reach thermal conductivities up to 10 W/mK (electrically insulating) or even 40 W/mK (electrically conductive) with graphite filler materials.

The cooling material that may be provided is, for example, Water, Acetone, Ammonia, Methanole or Ethanole. Specific cooling materials are well suitable for use in combination with a specific thermally conductive material of which the light source cooling body 100 is manufactured. When the thermally conductive material comprises Aluminum, the cooling material may comprise Acetone. When the thermally conductive material comprises Copper or Nickel, the cooling material may comprise Water.

In an embodiment of the light source cooling body 100, the hollow space 112, 114, 116 is provided with the cooling material and the opening 122 is gas and liquid tightly sealed.

In an embodiment, the thermal conductivity of the (shortest) thermal path from the evaporator 116 to the interface area 102 is at least 3 W/K. This thermal conductivity is determined by the (shortest) length of the thermal path from evaporator 116 to the interface area 102 and the thermal conductivity of the material of which the light source cooling body is manufactured.

The light source that may be coupled to the interface area 102 may be any light source. In specific embodiments of the light sources, the light source may be a solid state light emitter or a solid state light emitter package. Embodiments of solid state light emitters at least include Light Emitter Diodes and Laser Diodes. One solid state light emitter package may include one or more solid state light emitters. Optionally, one or more light source may be coupled to the interface area 102.

Specific examples of the light source cooling body 100 are provided in the subsequent figures. Details of the above discussed light source cooling body 100 also apply to subsequent embodiment unless it is explicitly stated that a specific feature has another implementation.

Figure 2A:
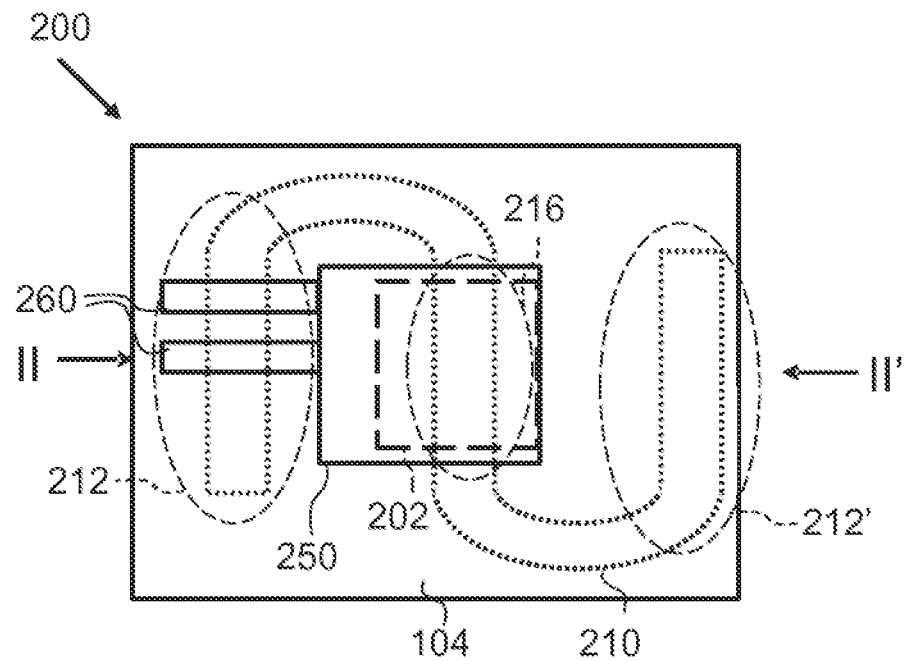

FIG. 2a schematically shows a top-view of an embodiment of a light source assembly 200 comprising a light source cooling body. The light source assembly comprises the body 104 of the light source cooling body in which a hollow space 210 is provided. In FIG. 2a it has been indicated that an area referred to with 216 is the evaporator 216 of the hollow space and that the areas 212, 212' are the condensers 212, 212'. On an outside surface of the body 104 is provided an interface area 202 to which a solid state light emitter 250 is thermally coupled. In use, heat generated in the solid state light emitter 250 is transferred through the thermally conductive material of the body 104 towards the evaporator for evaporating within the evaporator a cooling material in the liquid phase. As shown in FIG. 2a, the evaporator 216 is arranged in the direct vicinity of the interface area 202. The condensers 212, 212' are arranged away from the interface area 202. The portions of the body 104 that enclose the condensers 212, 212' are able to absorb heat from the condenser 212, 212' and, optionally, are able to provide the heat towards the environment of the light source assembly 200.

An optional element of the light source assembly 200 is also drawn in FIG. 2a, namely electrical conductive tracks 260 which are provided on the body 104 and are electrically isolated from the body 104. The electrical conductive tracks 260 follow a path towards the interface area 202 for providing power to the solid state light emitter 250. As can be seen in a subsequent figure, the solid state light emitter 250 is electrically coupled to the electrical conductive tracks 260.

Figure 2B:
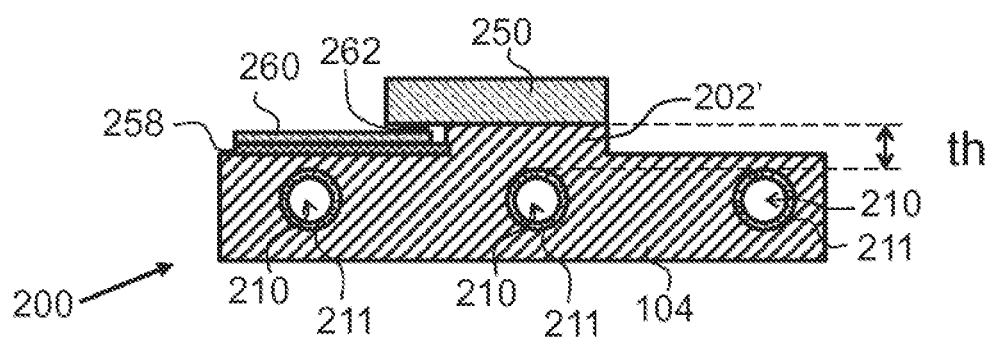

FIG. 2b schematically shows a cross-sectional view of the embodiment of FIG. 2a along line II-II'. FIG. 2b presents three cross-sectional views of the hollow space 210. The hollow space 210 is tubular shaped and, thus, the cross-sections are circular.

At the wall of the hollow space 210 is provided a wick 211. A wick 211 is a structure that provides a relatively large capillary pressure and is configured to transport cooling material in the liquid phase from the condenser towards the evaporator. The wick structure is also manufactured of the thermally conductive material of the body 104 and is, in practical embodiments, also in contact with the body 104 (e.g. to receive heat from or provide heat to the body 104). The wick 211 may comprise grooves, arteries, porous sponge-like structure, mesh-like structure to generate sufficient capillary pressure for transporting the cooling material in the liquid phase to an area of the evaporator where the cooling material may evaporate when heat is received by the evaporator. The presented hollow space 210 with the wick 211 together form a (regular non-loop) heat pipe.

In an embodiment, the wick 211 may comprise in between the evaporator 216 and the condensers 212, 212' channels for transporting a liquid and within the evaporator 216 and the condensers 212, 212' the channels are perforated to, depending on the specific space in which they are provided, to provide liquid or to receive liquid.

It is further shown in FIG. 2b that the interface area 202 is, in the embodiment of FIGS. 2a and 2b, a protrusion 202' that extends away from the evaporator 216 and extends out of the body 104. On a surface of the protrusion 202', which is a surface that faces away from the body 104, is provided the solid state light emitter 250. That surface is flat such that the solid state light emitter 250 can be well-thermally coupled to that surface. In other embodiments, when the light source is not flat, the surface of the protrusion may has a shape that corresponds to the shape of the light source. In between the protrusion 202' and the light source 250, a specific thermally conductive glue or thermally conductive pasta may be present for fastening the light source 250 to the protrusions 202'. The solid state light emitter 250 (or other types of light sources) may also be coupled to the interface area 202 by means of fastening element (not shown).

In FIG. 2b it is also shown that the electrical conductive tracks 260 are provided on a dielectric track 258 such that they are well electrically isolated from the body 104. The light source 250 is, for example, soldered to the electrical conductive tracks 260—as shown in FIG. 2b, some soldering material 262 may be present between the electrical conductive track 260 and the solid state light emitter 250.

The solid state light emitter 250 may be a flip chip Light Emitting Diode (LED). A light exit window of the flip chip LED is at a surface that faces away from the protrusion 202'. A surface of the flip chip LED that is opposite the light exit window is in contact with the protrusion 202' and partially extends beyond the protrusion. At the area that extends beyond the protrusion the flip chip LED has electrical contact areas that are coupled to the above discussed electrical conductive tracks 260.

Although not shown in FIGS. 2a and 2b the body 104 of the light source assembly 100 may have an interface to couple a heat sink to near the condensers 212, 212'. The heat sink interface may have a shape corresponding to a specific surface of a heat sink such that the heat sink can be easily thermally coupled to the heat sink interface. The heat sink interface may also comprise fastening elements to fasten the heat sink to the heat sink interface. The fastening elements may be a bore to receive, for example, a screw, may be a protruding element with, for example, a thread. The fastening elements may also be hooks or latches.

In FIG. 2b is also indicated a thickness th of the thermally conductive material that is in between the interface area 202 and the portion of the hollow space 210 that forms the evaporator 216. This thickness th should be relatively small to obtain a good thermal coupling between the light source and the evaporator 216. The thickness may be smaller than 2 mm, optionally smaller than 1.5 mm, and optionally smaller than 1 mm. The thickness is chosen such that the thermal conductivity from the interface area 202 towards the hollow space is larger than 3 W/mK.

Figure 3A:
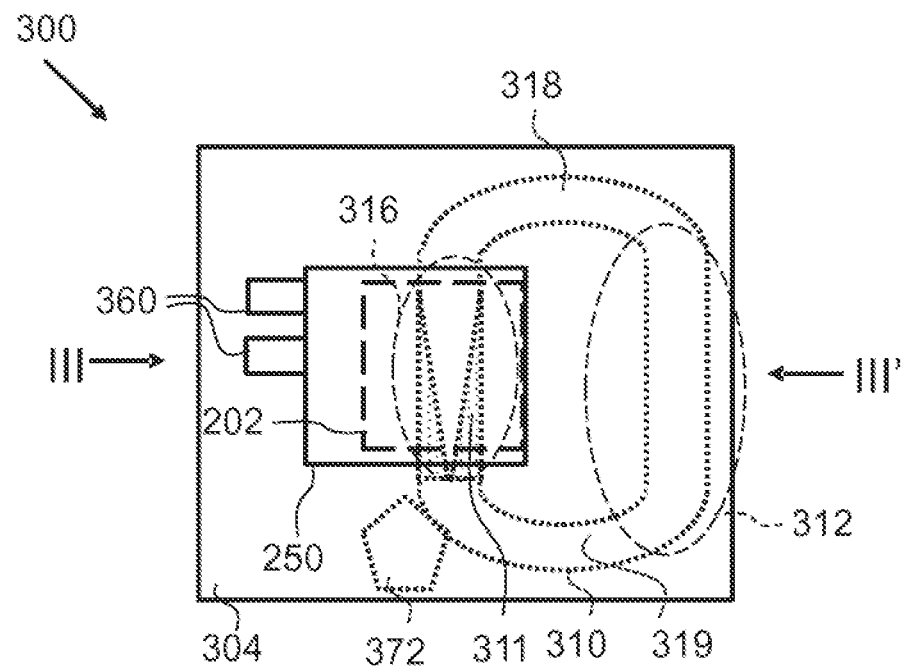

FIG. 3a schematically shows a top-view of another embodiment of a light source assembly 300 comprising a light source cooling body. The light source assembly 300 is similar to the light source assembly 200, however, the hollow space 310 forms together with the wick 311 a loop heat pipe. Furthermore, as shown in FIG. 3b, the light source assembly 300 comprises an optional arrangement of cooling fins 370.

As shown in the top-view, the hollow space 310 forms a loop. A region of the hollow space 310 near the interface area 202 is the evaporator 316 and a region of the hollow space 310 that is away from the interface area 202 is the condenser 312. A portion of the loop is the vapor channel 318 that transports the cooling material in the gaseous phase from the evaporator 316 to the condenser 312. Another portion of the loop is the liquid channel 319 that transports the cooling material in the liquid phase from the condenser towards the evaporator 316. The liquid channels 319 has, near the evaporator 316, a liquid reservoir 372 for (temporarily) storing some cooling material in the liquid phase. The evaporator 316 is provided with a wick 311 that has, in the specific embodiment of a loop heat pipe, a specific shapes that allows the transport of cooling material in the liquid phase from the liquid channel into the evaporator and that is configured to allow the evaporation of the cooling material at a surface of the wick 311 such that the evaporated cooling materials flows towards the vapor channel 318.

Figure 3B:
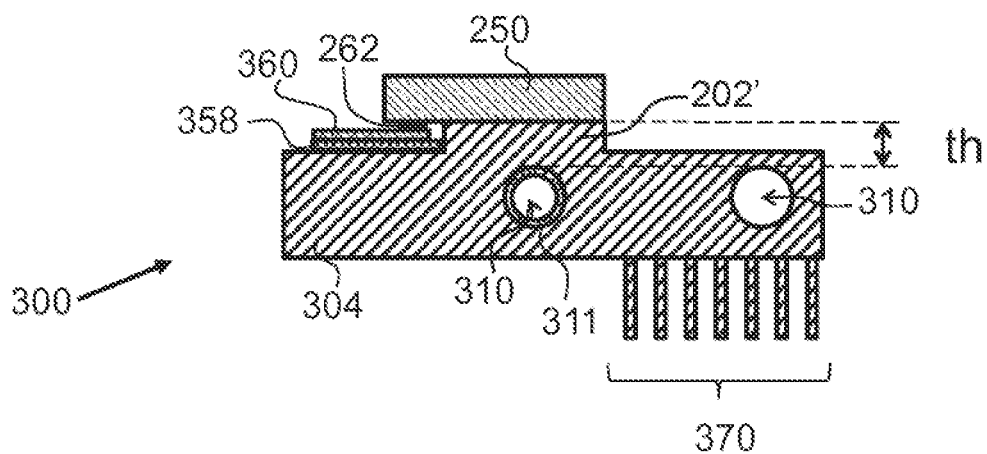

Because the hollow space has only at one region a condenser 312, a body 304 of the light source cooling body is smaller at the left side when being compared to the embodiment of FIG. 2, which results also in shorter electrical conductive tracks 360 (and, thus, as can be seen in FIG. 3b, shorter dielectric tracks).

FIG. 3b schematically shows a cross-sectional view of the another embodiment of the light source assembly 300 of FIG. 3a along line Only two cross-sections of the loop heat pipe formed by hollow space 310 can be seen in FIG. 3b. Near the evaporator 316 the wick 311 can be seen at the wall of the hollow space 310. Near the condenser 312, no wick 311 is present.

FIG. 3b also shows that the homogeneous body 304 of the light source assembly 300 may have an integral cooling fin structure 370. Integral means that, without any additional interface between the body 304 and, thus, the cooling fins, the body 304 and the cooling fin structure 370 form a single component. Thus, as well as the body 304 and the cooling fin structure 370 are made of the thermally conductive material. Although the cooling fin structure 370 is drawn as a series of thin parallel arranged plates, the cooling fins of the structure 370 may have any advantageous structure that allows the easy conduction of heat from the condenser 312 towards the environment of the light source assembly 300. In the example of FIG. 3b, the cooling fin structure 370 is drawn at a specific side of the light source assembly 300 that is opposite the surface where the light source 250 is thermally coupled to the interface area 202. However, in other examples, the cooling fins are provided at a side surface, or even at the side where the light source 250 is provided. The shape of the cooling fin structure 370 is at least selected such that light from the light source 250 can be easily transmitted into the ambient of the light source assembly 300 without being significantly obstructed by the cooling fin structure 370. However, when some light impinges on the cooling fins, they may be made light reflective to prevent the unwanted absorption of light. Additionally, it may be that the cooling fins fulfill a further role. The shape of a subset of the cooling fins may be adapted such that they form an optical element for influencing or shaping a light beam emitted by the light source assembly 300. For example, the subset of the cooling fins may form a reflector, a collimator or a slat collimator. The cooling fins that form an optical element may be provided with an additional light reflective coating to better reflect the impinging light. The additional light reflective coating may also be provided with an additive manufacturing technology.

Figure 4A:
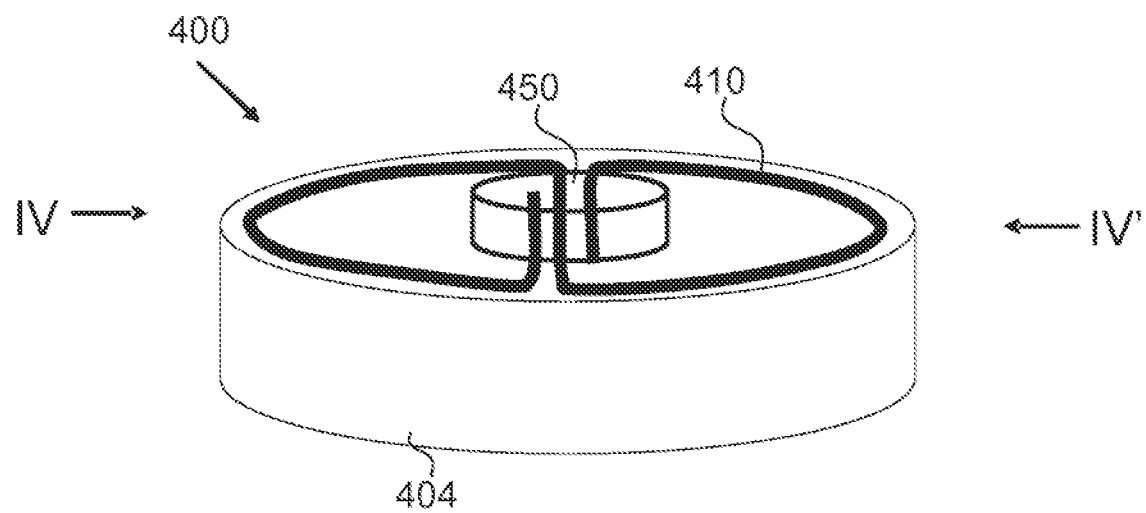
Figure 4B:
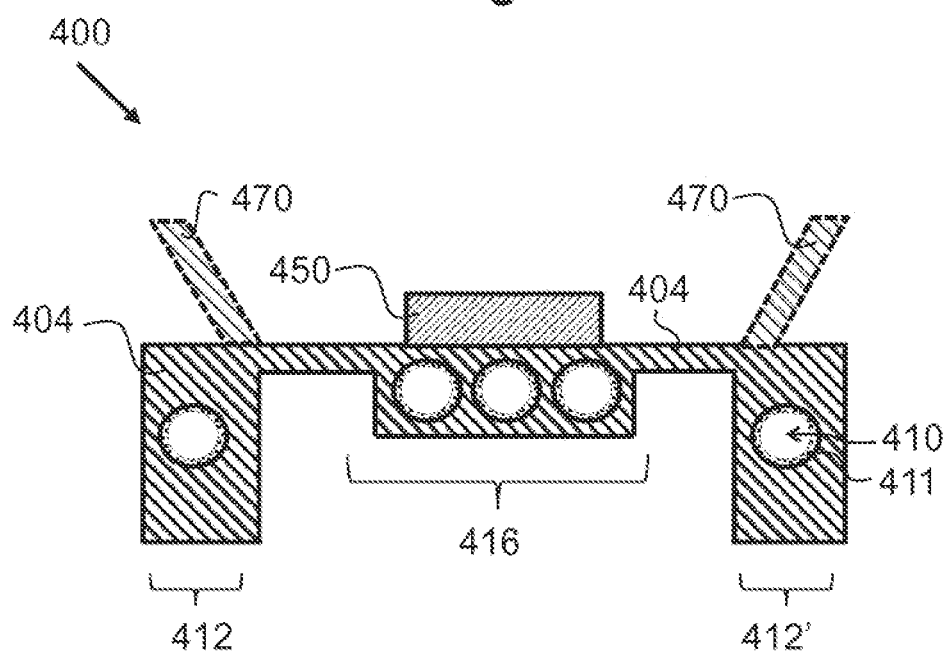

FIG. 4a schematically shows a three dimensional view of a further embodiment of a light source assembly 400 comprising a light source cooling body. The body 404 of the light source cooling body is circular/disk shaped. FIG. 4b schematically shows a cross-sectional view of the further embodiment of FIG. 2a along line IV-IV'. As seen in FIG. 4b, the body 404 is formed by a sort of disk that is arranged at the top side (top side of FIG. 4b) and has at its outer circumference a sort of cylindrical wall extending in a downwards direction. This cylindrical wall comprises a large portion of the hollow space 410 and this large portion forms the evaporator 412. The disk shaped top portion has in the middle an interface area to which a disk shaped light source 450 is thermally coupled. Below this interface area the body 404 is also thicker because it incorporates the evaporator 416 of the hollow space 410. By means of the thick black line in FIG. 4a it has been schematically presented what the trajectory of the hollow space is through the body 404. As seen in the cross-sectional view of FIG. 4b, three portions of the hollow space 410 extend below the interface area to which the light source 450 is thermally coupled. In the cylindrical wall one single winding of the hollow space 410 is provided—alternatively, more windings are provided in the cylindrical wall. The hollow space 410 comprises a wick 411 at its wall. In line with the embodiment of FIG. 2b, this hollow space 410 with wick 411 forms a (regular non-loop) heat pipe.

Please note in the case of FIGS. 4a and 4b all elements of the body 404, except of course the hollow space 410, form one integral homogenous body 404. One thermally conductive material is used for the body 404 and the wick 411.

Optionally, the light source assembly 400 of FIG. 4 comprises cooling fins 470 that extend away from a surface to which also the light source 450 is thermally coupled. The cooling fins 470 form, for example, a reflector for shaping the beam emitted by the light source assembly 400.

In an alternative embodiment, the hollow space is arranged in a different manner inside the light source assembly. The hollow space may be a meandering structure that meanders a plurality of times between a region immediately in the neighborhood of the interface area and an area that forms the condenser are (where the hollow space may deliver heat). The meandering structure may or may not form a loop. Such a hollow space forms a pulsating heat pipe when a cooling material, partly in the liquid phase, is provided in the hollow space. More information about this type of heat pipes can be found in the article "Closed and open loop pulsating heat pipes" of Sameer Khandekar, et al, published in the proceedings of "13$^{th}$ International Heat Pipe Conference" Shanghai, China, Sep. 21-25, 2004. The cited article is incorporated by reference.

Figure 7A:
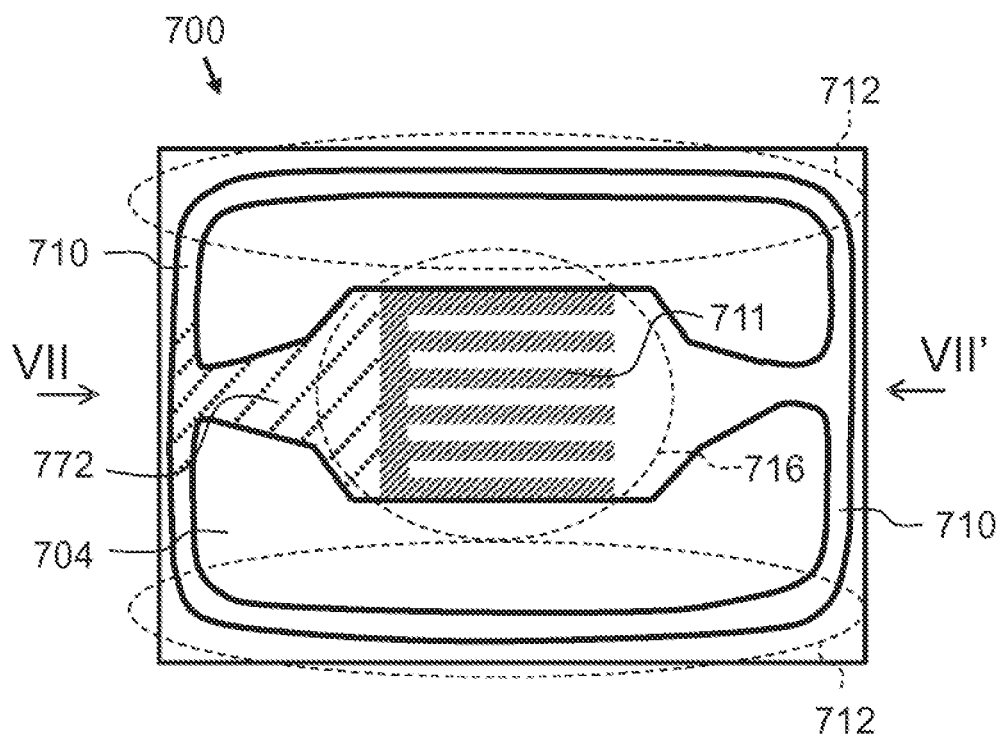
Figure 7B:
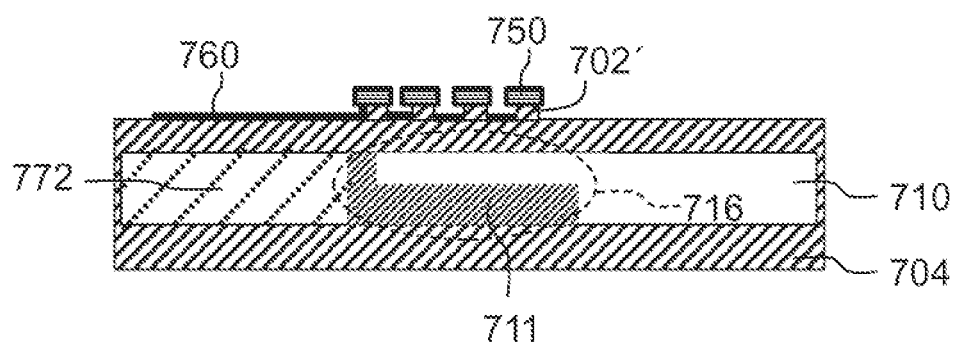

FIG. 7a schematically shows an embodiment of a light source assembly 700 comprising a light source cooling body. The light source cooling body comprises a homogenous body 704 made of single material and a hollow space 710 that comprises an evaporator 716 and two condensers 712. A portion of the hollow space 710 acts as a liquid reservoir 772 for holding a cooling material in the liquid phase. The evaporator 716 comprises a wick structure 711 that transports by means of a capillary action liquid from the liquid reservoir 772 into the evaporator 716. The wick structure 711 has at one side a wall that is in contact with the cooling material in the liquid phase. The wick structure 711 has also fingers that extend from the wall away from the cooling material in the liquid phase into the evaporator 716. As is shown in FIG. 7b, the evaporator is arranged in the direct vicinity of the location where light sources are thermally coupled to the homogenous body. The heat that is received from light sources evaporates the liquid in the evaporator. Because of the presence of the wick, the cooling material in the gaseous phase can only move via the channels of the open space 710 towards the condensers 712. The condensers are arranged away from the evaporator space and have, therefore, a lower temperature. The cooling material in the gaseous phase may provide its heat to the homogeneous body in the condenser and may condense towards the cooling liquid in the liquid phase. FIG. 7a present a sort of top view of the light source assembly 700 and it is to be noted that the presented view is a sort of cutaway drawing in which the top layer (that comprises the interface area) of the light source assembly 700 is not drawn.

FIG. 7b schematically shows a cross-sectional view of the embodiment of FIG. 7a along line VII-VII'. In the cross-sectional view the homogeneous body 704 is shown in which an open space 710 is provided. Within the open space is provided an evaporator 716 in which a which structure 711 is present. At a left side of the wick structure 711 is a liquid reservoir 772 that may comprise a cooling material in the liquid phase. As discussed above, the wick structure 711 has a wall that is in contact with the cooling material in the liquid phase. The wall extends from the bottom of the open space 710 towards the top surface of the open space 710 and prevents that all cooling material in the liquid phase can uncontrollably flow into the evaporator 716. The wick structure 711 allow the cooling material in the liquid phase to flow into the evaporator by a capillary action and, thus, in a controllable manner. The above discussed fingers of the wick structure 711 extend into the evaporator at one side of the open space 710. This one side is opposite the side of the open space that is closest to the interface area. The interface area is close to the evaporator 716 and comprises a plurality of protrusions 702' on which Light Emitting Diodes (LEDs) 750 are provided. The LEDs 750 are thermally coupled to the protrusions 702'. On a surface of the homogeneous body 704 are provided electrically conductive tracks 760 that provide power to the LEDs 750. The electrically conductive tracks 760 are electrically isolated from the homogeneous body 704.

Figure 5A:
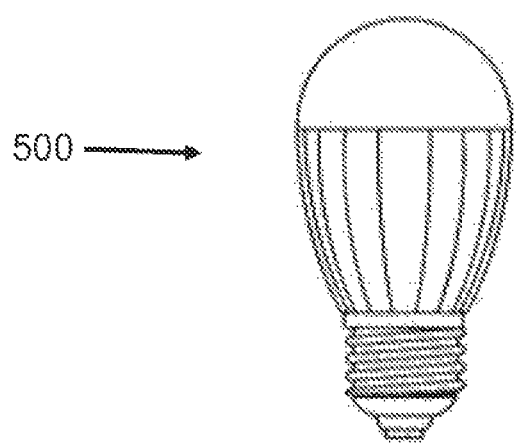

FIG. 5a schematically shows a light source assembly embodied in a lamp 500. The lamp 500 comprises (not shown) a light source cooling body according to one of the previous embodiments of the light source cooling body or comprises a light source assembly according to one of the previously discussed embodiments of the light source assembly.

Figure 5B:
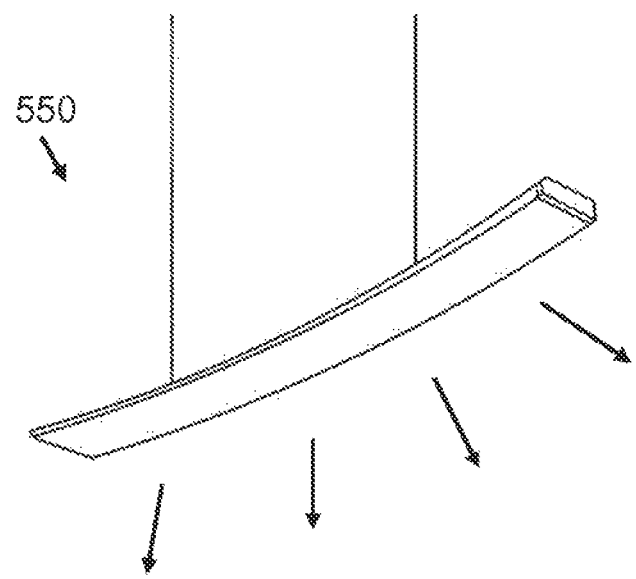

FIG. 5b schematically shows a luminaire 550. The luminaire 550 comprise one or more light source cooling bodies according to the previously discussed embodiments of the light source cooling bodies or comprises one or more light source assemblies according to one of the previously discussed embodiments of the light source assembly.

Figure 6:
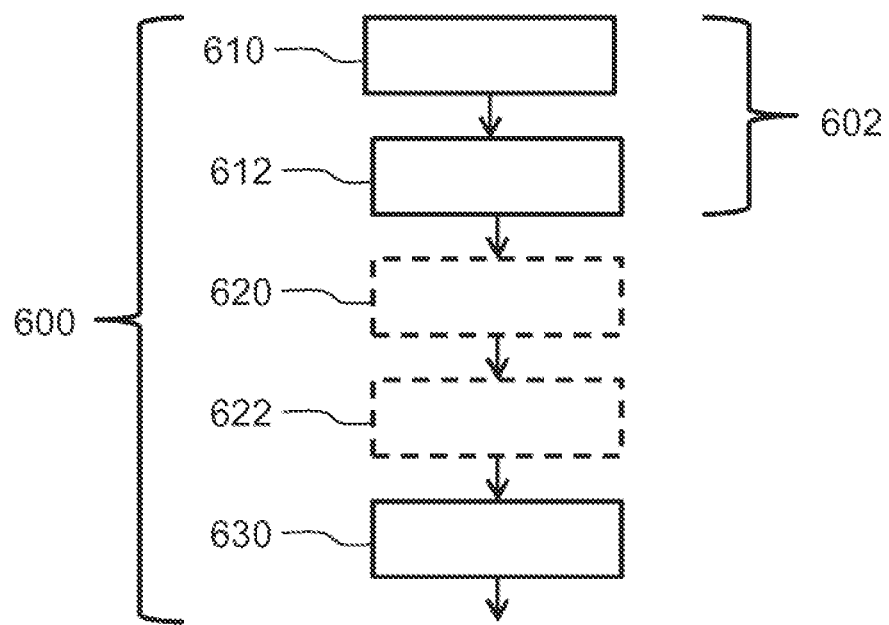

FIG. 6 schematically shows a method 602 of manufacturing a light source cooling body and a method 600 of manufacturing a light source assembly.

The method 602 of manufacturing a light source cooling body comprises receiving 610 a three dimensional model of a light source cooling body that comprises i) a hollow space comprising an evaporator and an condenser, the hollow space being configured to hold a cooling material partially in a gaseous phase and partially in a liquid phase, a wall of the hollow space being formed by the thermally conductive material; ii) an interface area being arranged to thermally couple a light source to and configured to receive heat from the light source, wherein a) the interface area being arranged in a direct vicinity of the evaporator and being separated by a thermally conductive wall from the evaporator for allowing heat of the light source to be transported towards the evaporator, b) the condenser being arranged away from the interface area where the light source cooling body has an interface to an environment of the light source cooling body, and c) except the interface area, the light source cooling body being a homogeneous body of the thermally conductive material. The method 602 of manufacturing a light source cooling body further comprises building up 612 the light source cooling body of a thermally conductive material by depositing layers on top of each other by means of an additive manufacturing technology according to the received three dimensional model of the light source cooling body.

Examples of additive manufacturing technologies are, for example, direct metal laser sintering, selective laser sintering, electron beam melting, fused deposition modeling, 3d printing based on extrusion and additive manufacturing based on using an arc wire. When such additive manufacturing technologies are used, one can easily optimize the shape of the light source cooling body and the shape of the hollow space. Traditionally, when heat pipes are used, the number of bends that can be made in the heat pipes are limited because it would damage the internal structure of the heat pipe too much, while with additive manufacturing the internal structure may be optimized at every position—for example, the shape of the hollow space may be optimized and/or a design of the wick may be optimized. Also, the above manufacturing method builds up the light source cooling body as a homogeneous component made of (optionally) one material. Thereby it is ensured that no interfaces are present in the light source cooling body with a relatively high thermal resistance. Thus, the manufacturing technology enables the manufacturing of light source cooling bodies which provide a better cooling of a light source. In an optional embodiment, the light source cooling body that is build up in layers is sintered.

The method 600 of manufacturing the light source assembly comprises the method 602 of manufacturing the light source cooling body and at least comprises thermally coupling 630 a light source to the interface area. Optionally, the method 600 of manufacturing the light source assembly comprises manufacturing 620 dielectric tracks of dielectric material on the light source cooling body. The dielectric tracks extending toward the interface area of the light source cooling body. Optionally, the method 600 of manufacturing the light source assembly comprises manufacturing 622 power tracks of an electrically conductive material on the dielectric tracks and providing, as part of the power tracks, connection areas at the interface area. The connection areas are for coupling the light source to. When dielectric tracks and power tracks are manufactured, in the stage of thermally coupling 630 a light source to the interface area, the light source is also electrically connected to the connection areas, for example, by soldering the light source power contacts to the contacting areas. The manufacturing of the isolation tracks and the power tracks and/or the soldering of the light source to the power contacting areas may also be performed by using additive manufacturing technologies (such as 3d printing), optionally, in combination with locally heating the added material.

Manufacturing the dielectric tracks and/or the power tracks may be performed with one of the subsequent technologies: 3d-printing/dispensing of the respective materials at the required location, Laser Induced Forward Transfer (LIFT), aerosol spray coating, or 2d/3d plasma metallization.

It is to be noted that in FIG. 6a it seems that specific steps are to be executed in a specific order. The above discussed methods are not limited to this order only. When appropriate, specific steps may be executed in another order, or in parallel to each other. For example, it may be that in the additive manufacturing technology, as soon as a surface of the light source cooling body is manufactured to which the light source may be thermally coupled and/or on which the dielectric tracks may be provided, the light source is already coupled to the interface area and/or the dielectric tracks are manufactured (e.g. in parallel to manufacturing further layers of the light source cooling body).

For example, the light source cooling body may be manufactured with one of the above discussed additive manufacturing technologies, on this manufactured light source cooling body the dielectric tracks (or layers) and the electrical conductive tracks may be manufactured/printed, subsequently solder bumps may be manufactured/printed, after which the light source (e.g. Light Emitting Diode) is assembled to the interface area, subsequently a reflow soldering stage may be used to solder the light source to the electrical conductive tracks, thereafter the hollow space may be filled with the cooling material after which, finally, the opening to the hollow space is gas and liquid tightly sealed. Alternative, the light source cooling body may be manufactured with one of the above discussed additive manufacturing technologies after which the hollow space may be filled with the cooling material after which the opening to the hollow space is gas and liquid tightly sealed, thereafter the dielectric tracks (or layers) and the electrical conductive tracks may be manufactured/printed, subsequently solder bumps may be manufactured/printed, after which the light source (e.g. Light Emitting Diode) is assembled to the interface area, subsequently a reflow soldering stage may be used to solder the light source to the electrical conductive tracks.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage. Further, the invention is not limited to the embodiments, and the invention lies in each and every novel feature or combination of features described above or recited in mutually different dependent claims.

Embodiments of the cooling body, the light source assembly, the luminaire, the method to manufacture such cooling bodies and the method to manufacture a light source assembly are defined in the subsequent numbered clauses:

1. A light source cooling body (100), substantially the whole light source cooling body (100) being manufactured of the same thermally conductive material, the light source cooling body (100) comprising:

a hollow space (210, 310, 410, 710) comprising an evaporator (116, 216, 316, 416, 716) and a condenser (112, 212, 312, 412, 712), the hollow space (210, 310, 410, 710) being configured to hold a cooling material partially in a gaseous phase and partially in a liquid phase, a wall of the hollow space (210, 310, 410, 710) being formed by the thermally conductive material, at least a portion (114) of the hollow space (210, 310, 410, 710) is tubular shaped, the hollow space (210, 310, 410, 710) further comprising a wick (211, 311, 411, 711) for transporting the cooling material in the liquid phase towards the evaporator (116, 216, 316, 416, 716) for being evaporated when the evaporator (116, 216, 316, 416, 716) receives heat, the wick (211, 311, 411, 711) being manufactured of the thermally conductive material, an interface area (102, 202) being arranged to thermally couple with a light source (250, 450, 750) and arranged to receive heat from the light source (250, 450, 750), the interface area (102, 202) being an outer area of the light source cooling body (100) arranged in a direct vicinity of the evaporator (116, 216, 316, 416, 716) and being separated by a thermally conductive wall from the evaporator (116, 216, 316, 416, 716) for allowing heat of the light source (250, 450, 750) to be transported towards the evaporator (116, 216, 316, 416, 716), wherein
    the condenser (112, 212, 312, 412, 712) being arranged away from the interface area (102, 202), except the hollow space (210, 310, 410, 710), the light source cooling body (100) being a homogeneous body (104, 304, 404, 704) of the thermally conductive material.

2. A light source cooling body (100) according to clause 1 further comprising cooling fins (370, 470) for providing a cooling interface area to ambient air, the condenser (112, 212, 312, 412, 712) being arranged near the cooling fins (370, 470) for providing a thermal path from the condenser (112, 212, 312, 412, 712) to the cooling fins (370, 470), wherein the cooling fins (370, 470) are part of the homogeneous body (104, 304, 404, 704) of the thermally conductive material.

3. A light source cooling body (100) according to any one of the preceding clauses, wherein a shape of the light source cooling body (100), and when referring to clause 2, optionally also a shape of the cooling fins (370, 470), is selected to allow a transmission of light generated by a light source (250, 450, 750) towards an ambient of the light source cooling body (100), wherein the light source (250, 450, 750) is provided on the interface area (102, 202).

4. A light source cooling body (100) according to any one of the preceding clauses, wherein the interface area (102, 202) comprises a protrusion (202', 702') having a flat surface facing away from the light source cooling body (100), wherein the flat surface is configured to thermally couple with a surface of a light source (250, 450, 750).

5. A light source cooling body (100) according to any one of the preceding clauses, wherein a thickness (th) of a thermally conductive wall between the interface area (102, 202) and the evaporator (116, 216, 316, 416, 716) is thinner than 2 millimeter.

6. A light source cooling body (100) according to any one of the preceding clauses comprising a heat sink interface area arranged to thermally couple with a heat sink and configured to provide heat to the heat sink, the heat sink interface area being a further outside area of the light source cooling body (100) arranged close to the condenser (112, 212, 312, 412, 712) and optionally comprising connector elements for connecting a heat sink to the heat sink interface area.

7. A light source cooling body (100) according to any one of the preceding clauses, wherein the wall of the hollow space (210, 310, 410, 710) is at least partially covered with the wick (211, 311, 411, 711) for transporting the cooling material in the liquid phase from the condenser (112, 212, 312, 412, 712) towards the evaporator (116, 216, 316, 416, 716).

8. A light source cooling body (100) according to any one of the preceding clauses, wherein the hollow space (210, 310, 410, 710) forms a loop in which a vapor channel (318) is provided from the evaporator (116, 216, 316, 416, 716) towards the condenser (112, 212, 312, 412, 712) and a liquid channel (319) is provided from the condenser (112, 212, 312, 412, 712) to the evaporator (116, 216, 316, 416, 716), the wick (211, 311, 411, 711) being arranged to receive cooling material in the liquid phase from the liquid channel (319) or a liquid reservoir (372, 772) being fed by the liquid channel (319), the wick (211, 311, 411, 711) at least extending into the evaporator (116, 216, 316, 416, 716).

9. A light source cooling body (100) according to any one of the preceding clauses, wherein at least one of:
    the thermally conductive material comprising at least one of Aluminum, Copper, Magnesium, Iron, Nickel, CrNi steel, Carbon steel, a Copper-Zinc alloy, a Copper-Tin alloy, a thermally conducive plastic material, and a thermally conductive ceramic material such as Aluminum Nitride, Aluminum Oxide, Beryllium Oxide, Boron Nitride, Silicon Carbide, Titanium Oxide, Magnesium Oxide, Zinc Oxide, Silicon Nitride, Zirconium Oxide, Tungsten Carbide,
    the cooling material comprising at least one of Water, Acetone, Ammonia, Methanole and Ethanole.

10. A light source assembly (200, 300, 400, 700) comprising:
    the light source cooling body (100) according to any one of the clauses 1 to 9,
    a light source (250, 450, 750) provided on and being thermally coupled to the interface area (102, 202).

11. A light source assembly (200, 300, 400, 700) according to clause 10 further comprising electric conductors (360, 760) being provided on and isolated from the light source cooling body (100) for providing electrical power to the light source (250, 450, 750).

12. A light source assembly (200, 300, 400, 700) according to clause 10 or clause 11, wherein, when the light source cooling body (100) is a light source cooling body according to clause 2, a portion of the cooling fins (370, 470) are also arranged as an optical element for influencing, in use, a light beam emitted by the light source assembly (200, 300, 400, 700).

13. A luminaire (550) comprising the light source cooling body (100) according to any one of the clauses 1 to 9 or comprising a light source assembly (200, 300, 400, 700) according to any one of the clauses 10 to 12.

14. Method (602) of manufacturing a light source cooling body, the method comprising:
receiving (610) a three dimensional model of a light source cooling body that comprises i) a hollow space comprising an evaporator and an condenser, the hollow space being configured to hold a cooling material partially in a gaseous phase and partially in a liquid phase, a wall of the hollow space being formed by the thermally conductive material, at least a portion of the hollow space is tubular shaped, the hollow space further comprising a wick for transporting the cooling material in the liquid phase towards the evaporator for being evaporated when the evaporator receives heat; ii) an interface area being arranged to thermally couple a light source to and configured to receive heat from the light source, wherein a) the interface area being arranged in a direct vicinity of the evaporator and being separated by a thermally conductive wall from the evaporator for allowing heat of the light source to be transported towards the evaporator, b) the condenser being arranged away from the interface area where the light source cooling body has an interface to an environment of the light source cooling body, and c) except the interface area, the light source cooling body being a homogeneous body of the thermally conductive material,
building (612) up the light source cooling body of a thermally conductive material by depositing layers on top of each other by means of an additive manufacturing technology according to the received three dimensional model of the light source cooling body.

15. A method (600) of manufacturing a light source assembly, the method comprising the method (602) of manufacturing a light source cooling body according to clauses 14 and further comprising:
manufacturing (620) dielectric tracks of dielectric material on the light source cooling body, the dielectric tracks extending toward the interface area of the light source cooling body,
manufacturing (622) power tracks of an electrically conductive material on the dielectric tracks and providing connection areas at the interface area, the connection areas are for electrically coupling the light source to,
thermally coupling (630) a light source to the interface area and electrically connecting the light source to the connection areas.

The invention claimed is:

1. A light source cooling body, substantially the whole light source cooling body being manufactured of the same thermally conductive material, the light source cooling body comprising:
a hollow space comprising an evaporator and a condenser, the hollow space being configured to hold a cooling material partially in a gaseous phase and partially in a liquid phase, a wall of the hollow space being formed by the thermally conductive material, at least a portion of the hollow space is tubular shaped, the hollow space further comprising a wick for transporting the cooling material in the liquid phase towards the evaporator for being evaporated when the evaporator receives heat, the wick being manufactured of the thermally conductive material; and
an interface area being arranged to thermally couple with a light source and arranged to receive heat from the light source, the interface area being an outer area of the light source cooling body arranged in a direct vicinity of the evaporator and being separated by a thermally conductive wall from the evaporator for allowing heat of the light source to be transported towards the evaporator;
wherein the condenser is arranged away from the interface area,
wherein the hollow space is formed within the light source cooling body, the light source cooling body being a planar body of the thermally conductive material;
wherein the interface area comprises a protrusion protruding perpendicularly from the planar body, the protrusion having a flat surface facing away from the light source cooling body, wherein the flat surface is configured to thermally couple with a surface of the light source;
wherein the hollow space forms a non-loop heat pipe; and
wherein the wick extends from the condenser into the evaporator to transport the cooling material in the liquid phase from the condenser towards the evaporator.

2. The light source cooling body according to claim 1 further comprising cooling fins for providing a cooling interface area to ambient air, the condenser being arranged near the cooling fins for providing a thermal path from the condenser to the cooling fins, wherein the cooling fins are part of the body of the thermally conductive material.

3. The light source cooling body according to claim 1, wherein a shape of the light source cooling body is selected to allow a transmission of light generated by the light source towards an ambient of the light source cooling body, wherein the light source is provided on the interface area.

4. The light source cooling body according to claim 1, wherein a thickness of a thermally conductive wall between the interface area and the evaporator is thinner than 2 millimeter.

5. The light source cooling body according to claim 1 comprising a heat sink interface area arranged to thermally couple with a heat sink and configured to provide heat to the heat sink, the heat sink interface area being a further outside area of the light source cooling body arranged close to the condenser and optionally comprising connector elements for connecting a heat sink to the heat sink interface area.

6. The light source cooling body according to claim 1, wherein at least one of:
the thermally conductive material comprises at least one of Aluminum, Copper, Magnesium, Iron, Nickel, CrNi steel, Carbon steel, a Copper-Zinc alloy, a Copper-Tin alloy, a thermally conducive plastic material, and a thermally conductive ceramic material such as Aluminum Nitride, Aluminum Oxide, Beryllium Oxide, Boron Nitride, Silicon Carbide, Titanium Oxide, Magnesium Oxide, Zinc Oxide, Silicon Nitride, Zirconium Oxide, Tungsten Carbide, or
the cooling material comprises at least one of Water, Acetone, Ammonia, Methanole and Ethanole.

7. The light source cooling body according to claim 1, wherein the light source cooling body is part of a light source assembly, the light source assembly comprising
a light source provided on and being thermally coupled to the interface area.

8. The light source cooling body according to claim 7, wherein the light source assembly further comprises electric conductors being provided on and isolated from the light source cooling body for providing electrical power to the light source.

9. The light source cooling body according to claim 7, comprising cooling fins that are arranged as an optical element for influencing, in use, a light beam emitted by the light source assembly.

10. The light source cooling body according to claim 7, wherein the light source is a flip chip Light Emitting Diode being provided on the protrusion, a light exit window of the flip chip Light Emitting Diode faces away from the flat surface of the protrusions, the flip chip Light Emitting Diode has an opposite surface opposite the light exit window, a portion of an opposite surface is provided on the flat surface and another portion of the opposite surface extends beyond the protrusion and comprises electrical contact areas.

11. A luminaire comprising the light source cooling body according to claim 1.

12. A method of manufacturing a light source cooling body, the method comprising:
receiving a three dimensional model of a light source cooling body that comprises i) a hollow space comprising an evaporator and an condenser, the hollow space being configured to hold a cooling material partially in a gaseous phase and partially in a liquid phase, a wall of the hollow space being formed by the thermally conductive material, at least a portion of the hollow space is tubular shaped, the hollow space further comprising a wick for transporting the cooling material in the liquid phase towards the evaporator for being evaporated when the evaporator receives heat; ii) an interface area being arranged to thermally couple a light source to and configured to receive heat from the light source, wherein a) the interface area being arranged in a direct vicinity of the evaporator and being separated by a thermally conductive wall from the evaporator for allowing heat of the light source to be transported towards the evaporator, b) the condenser being arranged away from the interface area where the light source cooling body has an interface to an environment of the light source cooling body, c) except the interface area, the light source cooling body being a planar body of the thermally conductive material wherein the hollow space is formed within the planar body, and, d) the interface area comprises a protrusion protruding perpendicularly from the planar body, the protrusion having a flat surface facing away from the light source cooling body, the flat surface being configured to thermally couple with a surface of the light source;
building up the light source cooling body of a thermally conductive material by depositing layers on top of each other by means of an additive manufacturing technology according to the received three dimensional model of the light source cooling body;
wherein the hollow space forms a non-loop heat pipe; and
wherein the wick extends from the condenser into the evaporator to transport the cooling material in the liquid phase from the condenser towards the evaporator.

13. The method of manufacturing a light source assembly, the method comprising the method of manufacturing a light source cooling body according to claim 12 and further comprising:
manufacturing dielectric tracks of dielectric material on the light source cooling body, the dielectric tracks extending toward the interface area of the light source cooling body,
manufacturing power tracks of an electrically conductive material on the dielectric tracks and providing connection areas at the interface area, the connection areas are for electrically coupling the light source to,
thermally coupling a light source to the interface area and electrically connecting the light source to the connection areas.

14. An apparatus comprising, comprising:
a light source cooling body;
a non-loop heat pipe within the light source cooling body comprising an evaporator and a condenser, the non-loop heat pipe being configured to hold a cooling material partially in a gaseous phase and partially in a liquid phase;
an interface area arranged to thermally couple with a light source and arranged to receive heat from the light source, the interface area being an outer area of the light source cooling body arranged in a direct vicinity of the evaporator and being separated by a thermally conductive wall from the evaporator for allowing heat of the light source to be transported towards the evaporator; and
a wick that extends from the condenser into the evaporator to transport the cooling material in the liquid phase from the condenser towards the evaporator; and
wherein the condenser is arranged away from the interface area,
wherein the interface area comprises a protrusion protruding perpendicularly from the body, the protrusion having a flat surface facing away from the light source cooling body, wherein the flat surface is configured to thermally couple with a surface of the light source,
wherein the non-loop heat pipe is made of the thermally conductive material and is integrated within the light source cooling body, the light source cooling body being planar.

15. The apparatus according to claim 14, wherein the light source cooling body is formed from a thermally conductive material.

16. The apparatus according to claim 14, further comprising cooling fins for providing a cooling interface area to ambient air, the condenser being arranged near the cooling fins for providing a thermal path from the condenser to the cooling fins, wherein the cooling fins made of the thermally conductive material.

17. The apparatus according to claim 14, wherein a shape of the light source cooling body is selected to allow a transmission of light generated by the light source towards an ambient of the light source cooling body, wherein the light source is provided on the interface area.

18. The apparatus according to claim 14, wherein a thickness of a thermally conductive wall between the interface area and the evaporator is thinner than 2 millimeter.

19. The apparatus according to claim 14, further comprising a heat sink interface area arranged to thermally couple with a heat sink and configured to provide heat to the heat sink, the heat sink interface area being a further outside area of the light source cooling body arranged close to the condenser and optionally comprising connector elements for connecting a heat sink to the heat sink interface area.

20. The apparatus according to claim 14, wherein the thermally conductive material comprises at least one of Aluminum or Copper, and the cooling material comprises Water.

* * * * *